United States Patent [19]

Nagai et al.

[11] 4,393,337
[45] Jul. 12, 1983

[54] SWITCHING CIRCUIT

[75] Inventors: Tamiji Nagai, Kawasaki; Takeshi Matsushita, Sagamihara, both of Japan

[73] Assignee: Sony Corporation, Tokyo, Japan

[21] Appl. No.: 22,306

[22] Filed: Mar. 20, 1979

[30] Foreign Application Priority Data

Mar. 25, 1978 [JP] Japan .................. 53-34356

[51] Int. Cl.³ .................... H01J 29/70; H01L 29/74
[52] U.S. Cl. .................... 315/408; 307/305; 307/315; 307/252 A; 357/38
[58] Field of Search ............ 307/315, 305, 252 A; 315/408; 357/38 G, 38

[56] References Cited

U.S. PATENT DOCUMENTS

| | | | |
|---|---|---|---|
| 3,496,390 | 2/1970 | Fischer | 307/305 |
| 3,600,665 | 8/1971 | Pelly et al. | 307/252 A X |
| 3,603,817 | 9/1971 | Casson | 307/305 X |
| 3,652,877 | 3/1972 | Smith | 307/305 X |
| 3,784,871 | 1/1974 | Vacher | 315/408 |
| 3,821,565 | 6/1974 | Horinaga | 307/252 B |
| 3,896,317 | 7/1975 | Alcorn et al. | 307/315 X |
| 3,947,723 | 3/1976 | Thompson | 315/408 X |
| 3,969,653 | 7/1976 | Fukaya | 315/408 X |
| 4,002,931 | 1/1977 | Tsang et al. | 307/315 X |
| 4,058,741 | 11/1977 | Tokunaga et al. | 307/305 X |
| 4,142,115 | 2/1979 | Nakata et al. | 307/315 |
| 4,189,651 | 2/1980 | Akamatsu | 307/315 X |
| 4,227,099 | 10/1980 | Houkes | 307/315 |

OTHER PUBLICATIONS

"Characteristics of a 200 AMP Gate Turn-Off Thyristor" by E. D. Wolley et al., IEEE Industry Applications Society, Conference Record, IAS Annual Meeting, 1973 8th Annual Meeting, Oct. 8-11, 1973, pp. 251-257.

Primary Examiner—Malcolm F. Hubler
Attorney, Agent, or Firm—Lewis H. Eslinger; Alvin Sinderbrand

[57] ABSTRACT

First and second gate-controlled switches are connected analogously to a Darlington transistor pair with a slow-response diode connected to delay application of a turn-off signal to the second gate-controlled switch until the first gate-controlled switch is fully turned OFF. The Darlington-type connection reduces a drive current required from a driving source to maintain the second gate-controlled switch fully ON for passing a load current therethrough.

10 Claims, 15 Drawing Figures

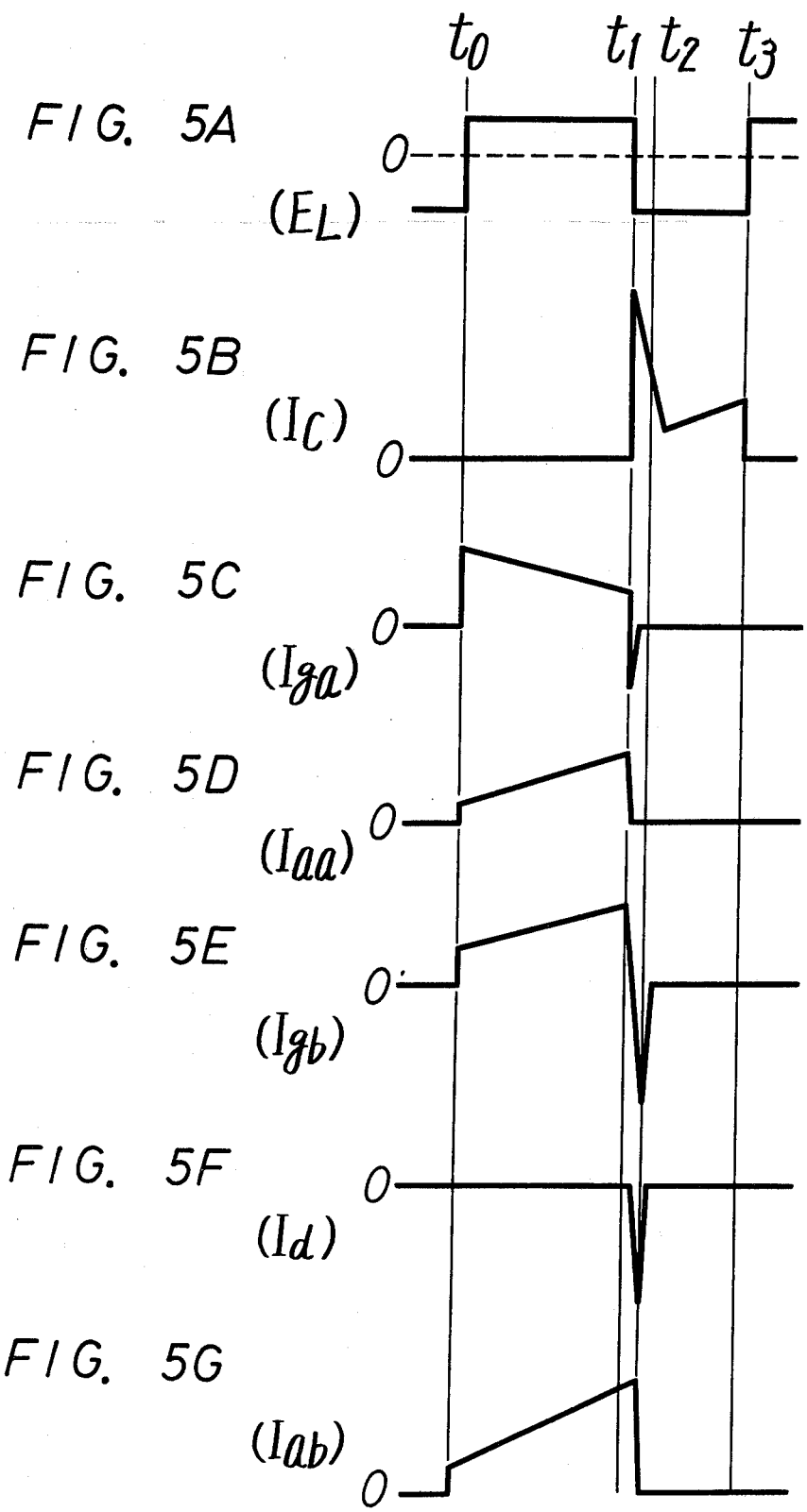

SWITCHING CIRCUIT

BACKGROUND OF THE INVENTION

1. Field of the Invention

This invention relates generally to a switching circuit and more particularly to a switching circuit using gate-controlled switches or gate turn-off switches for controlling the application of power to a load such as, for example, a horizontal deflection circuit of a television receiver, a switching regulator or an induction heating device.

2. Description of the Prior Art

The prior art employs gate-controlled switches to control power to a load. For example, a gate-controlled switch has been employed to control the application of power to a television horizontal deflection circuit. Gate-controlled switches are four layer, three junction, three terminal solid state devices constructed very much like a silicon controlled rectifier except that they have a turn-off ability which is controlled by a negative current pulse applied to a gate electrode. As used in the prior art, a relatively large gate current is required to maintain the gate-controlled switch in the fully ON or conducting condition. This places a relatively large burden on the circuit which applies gate current and results in large, heavy, expensive and heat generating devices.

OBJECTS AND SUMMARY OF THE INVENTION

It is an object of the present invention to provide a switching circuit free from the defects of the prior art.

It is a further object of the invention to provide a switching circuit in which a gate-controlled switch can be fully driven into the ON or conducting condition without requiring large drive signals and thus reduce the size and power consumption of the driving circuit.

It is a further object of the invention to provide a horizontal deflection circuit utilizing a pair of gate-controlled switches connected in a Darlington-type arrangement.

In accordance with an aspect of the invention, a switching circuit comprises a first gate-controlled switch having an ON condition and an OFF condition and a second gate-controlled switch having an ON condition and an OFF condition, the first and second gate-controlled switches being connected in a Darlington-type connection, and means for delaying changing of the second gate-controlled switch from its ON to its OFF condition until the first gate-controlled switch is changed from its ON to its OFF condition.

According to a feature of the invention, a switching circuit comprises a first gate-controlled switch having a first anode electrode, a first cathode electrode and a first gate electrode, the first gate electrode being an input terminal of the switching circuit. The switching circuit further includes a second gate-controlled switch having a second anode electrode, a second cathode electrode and a second gate electrode. The first and second anode electrodes are connected together and comprise a first load terminal. The second cathode electrode is a second load terminal of the switching circuit wherein the first and second load terminals are connectable in series with the current path of a load for the control of current therethrough. The first cathode electrode is connected to the second gate electrode and a diode is connected with its cathode terminal connected to the first gate electrode and its anode terminal connected to the second gate electrode.

The above, and other features and advantages of the present invention will become apparent from the following description read in conjunction with the accompanying drawings in which like reference numerals designate the same elements.

BRIEF DESCRIPTION OF THE DRAWINGS

FIGS. 5A–5G are wave-form diagrams to which reference will be made in explaining the operation of the circuit shown in FIG. 4;

DESCRIPTION OF THE PREFERRED EMBODIMENTS

Figure 1:
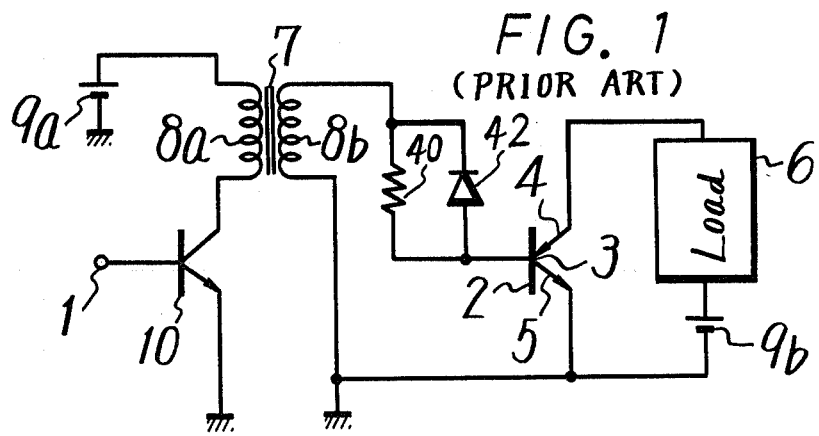
FIG. 1 is a schematic diagram of a switching circuit according to the prior art.

Referring now to FIG. 1, there is shown a switching circuit according to the prior art employing a gate-controlled switch 2 which controls the application of power to a load 6. A drive transistor 10, controlled at its base by drive signals at an input terminal 1, alternately connects and disconnects one end of a primary winding 8a of a drive transformer 7 to ground. The second end of primary winding 8a is supplied with power by a power supply 9a. The varying signal in the primary winding 8a induces a signal in secondary winding 8b which is applied through a resistor 40 to a gate electrode 3 of gate-controlled switch 2. When the signal fed through resistor 40 to gate electrode 3 is positive, gate-controlled switch 2 is turned ON to complete a low resistance path from a power supply source 9b through the load 6 and the anode electrode 4 and cathode electrode 5 of gate-controlled switch 2. The positive voltage applied to resistor 40 also back-biases a diode 42 connected in parallel therewith.

When the polarity of the signal at secondary winding 8b of drive transformer 7 reverses, the resulting negative voltage forward biases diode 42 and applies a negative voltage signal to the gate electrode 3 of gate-controlled switch 2. The negative voltage signal produces a negative current flow which cuts off, or makes nonconductive, gate-controlled switch 2 and thereby interrupts the electric circuit through load 6.

As described in the preceding, gate-controlled switch 2 is turned ON and OFF by positive and negative voltages, respectively supplied to the gate electrode 3 from secondary winding 8b of drive transformer 7. However, in order to keep the voltage between anode electrode 4 and cathode electrode 5 of gate-controlled switch 2 sufficiently low to provide a low resistance path therethrough for load current, the drive current in the positive direction fed to gate-controlled switch 2 must be large. This requires a large drive transformer 7 having a wide bandwidth. In order to provide sufficient drive to drive transformer 7, drive transistor 10 must also be large to withstand the heat which must consequently be dissipated therein.

Figure 2:
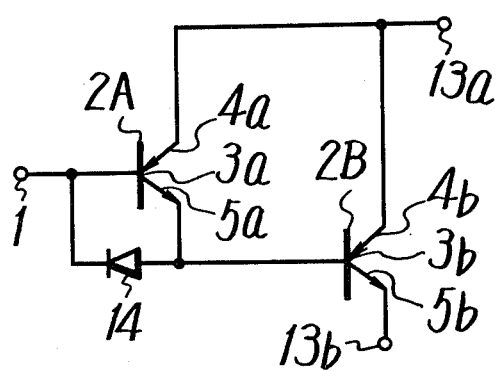
FIG. 2 is a schematic diagram showing a switching circuit according to an embodiment of the present invention.

Referring now to FIG. 2, there is shown a switching circuit according to an embodiment of the present invention. A first gate-controlled switch 2A and a second gate-controlled switch 2B are interconnected in a manner similar to a Darlington amplifier. This connection will hereinafter be referred to as a Darlington-type connection. First gate-controlled switch 2A has its gate electrode 3a connected to input terminal 1 and its anode electrode 4a connected to a load terminal 13a. A cathode electrode 5a of gate-controlled switch 2A is connected to gate electrode 3b of second gate-controlled switch 2B. An anode terminal 4b of second gate-controlled switch 2B is also connected to load terminal 13a. A cathode terminal 5b of second gate-controlled switch 2B is connected to a load terminal 13b. A diode 14 has its cathode terminal connected to the gate electrode 3a of gate-controlled switch 2A and its anode terminal connected to the junction of cathode electrode 5a of gate-controlled switch 2A and the gate electrode 3b of second gate-controlled switch 2B. Diode 14 is selected to take a relatively long time to change from the reverse biased condition to the forward biased condition relative to the turn-off time of gate-controlled switch 2A. Thus, a negative turn-off signal applied at input terminal 1 is effective to turn OFF gate-controlled switch 2A before a negative turn-off signal can be transmitted through diode 14 to gate electrode 3b of second gate-controlled switch 2B.

When a positive signal is applied to input terminal 1, a gate current flows from gate electrode 3a to cathode electrode 5a of gate-controlled switch 2A. In addition, the gate current produces an anode current in gate-controlled switch 2A flowing from anode electrode 4a to cathode electrode 5a. Consequently, the current in cathode electrode 5a of gate-controlled switch 2A is the sum of the gate and anode currents. This amounts to an effective amplification of the current applied to gate electrode 3a of gate-controlled switch 2A. The cathode current in cathode electrode 5a is applied to the gate electrode 3b of second gate-controlled switch 2B. This effectively turns ON second gate-controlled switch 2B and produces a cathode current in cathode electrode 5b which is the sum of the gate current in gate electrode 3b and the anode current in anode electrode 4b. The relatively high value of gate current applied to gate electrode 3b resulting from the combination of gate and anode currents in gate-controlled switch 2A ensures that second gate-controlled switch 2B is placed in the fully ON condition with a relatively small gate current in gate electrode 3a of gate-controlled switch 2A. This reduces the drive signal required at input terminal 1.

When a negative signal appears at input terminal 1, gate-controlled switch 2A is turned OFF and thus terminates the gate current applied to the gate terminal 3b of second gate-controlled switch 2B. As is characteristic of such devices however, the flow of anode-to-cathode current continues even in the absence of gate current until a negative turn-off signal is received at gate electrode 3b. Diode 14 is properly polarized to apply a negative turn-off signal to gate electrode 3b of second gate-controlled switch 2B. However, diode 14 is selected to have a delay time in changing from its reverse biased, or non-conducting, condition to its forward biased, or conducting, condition which is longer than the time required for a negative pulse to turn OFF gate-controlled switch 2A. Consequently, gate-controlled switch 2A is always turned OFF before a negative turn-off signal is applied through diode 14 to gate electrode 3b of second gate-controlled switch 2B. In this way, gate-controlled switch 2A is always turned OFF before gate-controlled switch 2B is turned OFF.

Figure 3:
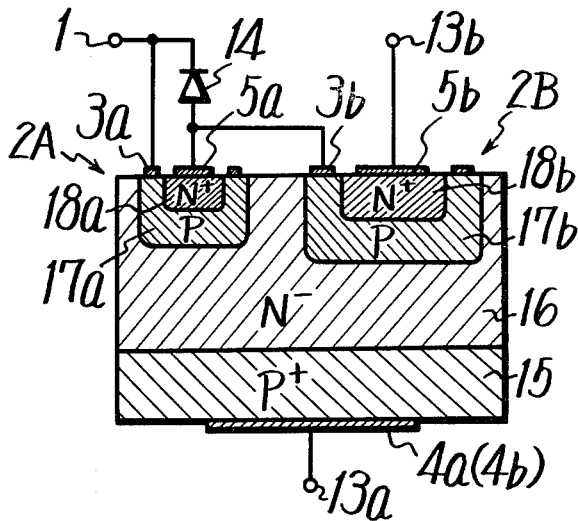
FIG. 3 is a cross sectional diagram of an integrated version of the switching circuit of FIG. 2.

Referring now to FIG. 3, there is shown a cross-sectional view of the switching circuit of FIG. 2 wherein gate-controlled switches 2A and 2B are formed as an integrated circuit in a single semi-conductor pellet. A P-type conductivity region 15 forms a first junction with an N-type conductivity region 16. Two islands or regions 17a and 17b of P-type conductivity are locate in N-type conductivity region 16, each forming a second junction with N-type conductivity region 16. Smaller islands or regions 18a and 18b of N-type conductivity are embedded in the islands of 17a and 17b of P-type conductivity, respectively, and form third junctions therewith. Islands 18a and 17a, together with conductivity regions 16 and 15, make up gate-controlled switch 2A. Islands 18b and 17b, together with conductivity regions 16 and 15, make up second gate-controlled switch 2B. It is to be noted that conductivity regions 16 and 15 are shared by gate-controlled switches 2A and 2B. Anode electrode 4a, which also serves as anode electrode 4b is ohmically connected to P-type conductivity region 15 and provides means for the connection of load terminal 13a. Gate electrodes 3a and 3b are ohmically connected respectively to islands 17a and 17b. Cathode electrodes 5a and 5b are ohmically connected respectively to islands 18a and 18b. The cathode terminal of diode 14 is connected to gate electrode 3a and its anode terminal is connected to the junction of cathode electrode 5a and gate electrode 3b. Input terminal 1 is connected to the junction of gate electrode 3a and the cathode terminal of diode 14. Load terminal 13b is connected to cathode electrode 5b.

As is apparent from an examination of FIGS. 2 and 3, the integrated fabrication of gate-controlled switches 2A and 2B is peculiarly adapted to use in a Darlington-type connection. This arises because the Darlington-type connection requires the parallel connection of anode terminals 4a and 4b. The sharing of conductivity regions 15 and 16 between gate-controlled switches 2A and 2B intrinsically provides this parallel connection. In addition, as interconnected by diode 14 and the connection between cathode 5a and gate electrode 3b, the integrated device of FIG. 3 becomes a 3-terminal gate-controlled switch which can be rapidly and cheaply manufactured, due to its integrated fabrication, and can be rapidly and cheaply installed in a circuit due to the need for only three external connections.

Figure 4:
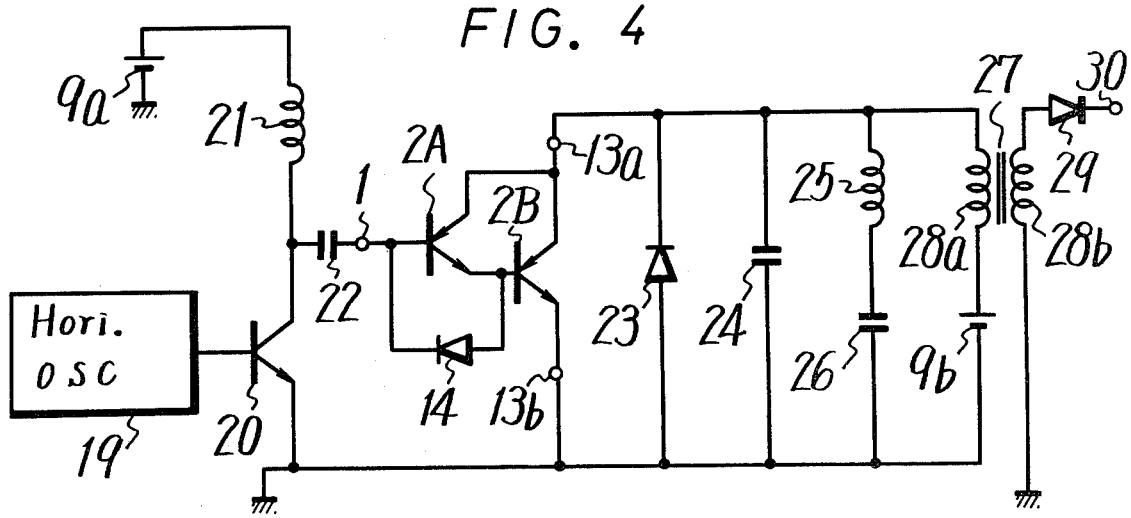
FIG. 4 is a schematic diagram showing a horizontal deflection circuit of a television receiver employing the switching circuit shown in FIG. 2.

Referring now to FIG. 4, there is shown a horizontal deflection circuit for a television receiver employing a switching circuit of the type shown in FIGS. 2 and 3. A horizontal oscillator 19, whose output frequency may be controlled by an automatic frequency control voltage from an automatic frequency control circuit, not shown, applies its output frequency to a base of a transistor 20. The emitter of transistor 20 is connected to ground and its collector is connected to one end of a coil 21. The second end of coil 21 is connected to a power supply source 9a. The junction of coil 21 and the collector of transistor 20 is connected to one terminal of a capacitor 22. The second terminal of capacitor 22 is connected to input terminal 1 of the switching device. Gate-controlled switches 2A and 2B and diode 14 are identical to those described in connection with FIG. 2 and FIG. 3. Load terminals 13a and 13b of the switching device are connected to a load which consists of a damper diode 23, resonant capacitor 24, a series combination of a horizontal deflection coil 25 and an S-shape correction capacitor 26 as well as a series connection of a primary winding 28 of a fly-back transformer 27 with a power supply source 9b, all connected in parallel with each other. One terminal of a secondary winding 28b of fly-back transformer 27 is connected to a diode 29. The other terminal of secondary winding 28b of fly-back transformer 27 is connected to ground. A high voltage appears at output terminal 30 of diode 29.

Referring now also to FIGS. 5A–5G and 6A–6C, the operation of the horizontal deflection circuit of FIG. 4 is described. Horizontal oscillator 19 whose frequency may be synchronized by an automatic frequency control circuit (not shown) produces an alternating output which alternately turns transistor 20 ON and OFF. Assuming that transistor 20 is turned OFF at time $t_0$, a voltage $E_L$ (FIG. 5A) appears at the junction of capacitor 22 and coil 21. This causes a current to flow in the direction shown by the arrow in the simplified equivalent circuit of FIG. 6A. As shown, the current flows from power supply source 9a, through coil 21, capacitor 22 and the series combination of gate-cathode paths of gate-controlled switches 2A and 2B to ground. Capacitor 22 is charged with the polarity shown in FIG. 6A during this time. The gate current $I_{ga}$ (FIG. 5C) in gate-controlled switch 2A produces an anode current $I_{aa}$ (FIG. 5D). The cathode current in gate-controlled switch 2A is the gate current $I_{gb}$ (FIG. 5E) applied to the gate of second gate-controlled switch 2B. This gate current $I_{gb}$ (FIG. 5E) is the sum of the gate ($I_{ga}$) and anode ($I_{aa}$) currents of gate-controlled switch 2A. This relatively large value of gate current $I_{gb}$ in gate-controlled switch 2B turns gate-controlled switch 2b fully ON. An anode current $I_{ab}$ (FIG. 5G) flows from the load through load terminal 13a between times $t_0$ and $t_1$.

At time $T_1$, transistor 20 is turned ON by the output of horizontal oscillator 19. The charge stored in capacitor 22 is discharged in the direction indicated by an arrow in the simplified equivalent circuit of FIG. 6B. In addition, a path, indicated by a second arrow, is provided from power supply source 9a through coil 21 and the collector-emitter path of transistor 20 to ground. The total current $I_c$ through transistor 20 is shown in FIG. 5B. Due to the polarity of the charge stored in capacitor 22, when transistor 20 becomes conductive, a negative voltage is applied to terminal 1. The resulting negative current flow induced by the charge stored in capacitor 22 cuts off anode current $I_{aa}$ (FIG. 5D) in gate-controlled switch 2A but is incapable of cutting off anode current $I_{ab}$ in gate-controlled switch 2B at this time since there is no path available for applying a negative cut off signal to the gate of gate-controlled switch 2B. As previously explained, diode 14 is effective to delay the arrival of a negative cut off signal at the gate of gate-controlled switch 2B until after gate-controlled switch 2A is fully OFF.

A short time later at time $t_2$, when gate-controlled switch 2A is OFF, simplified equivalent circuit 6C illustrates the next step in the operation. At time $t_2$, (FIG. 5F), diode 14 has changed condition from non-conducting to conducting and provides a path for negative current $I_d$ to the gate of gate-controlled switch 2B. The resulting negative current signal (FIG. 5F) is effective to turn OFF anode current $I_{ab}$ (FIG. 5G) of gate-controlled switch 2B. Due to the delay provided by diode 14, although the anode current $I_{aa}$ of gate-controlled switch 2A is turned OFF at time $t_1$, the anode current $I_{ab}$ of gate-controlled switch 2B continues to a slightly later time $t_2$. This ensures that full cut off of gate-controlled switch 2A is completed before cut off of gate-controlled switch 2B occurs.

Figure 7:
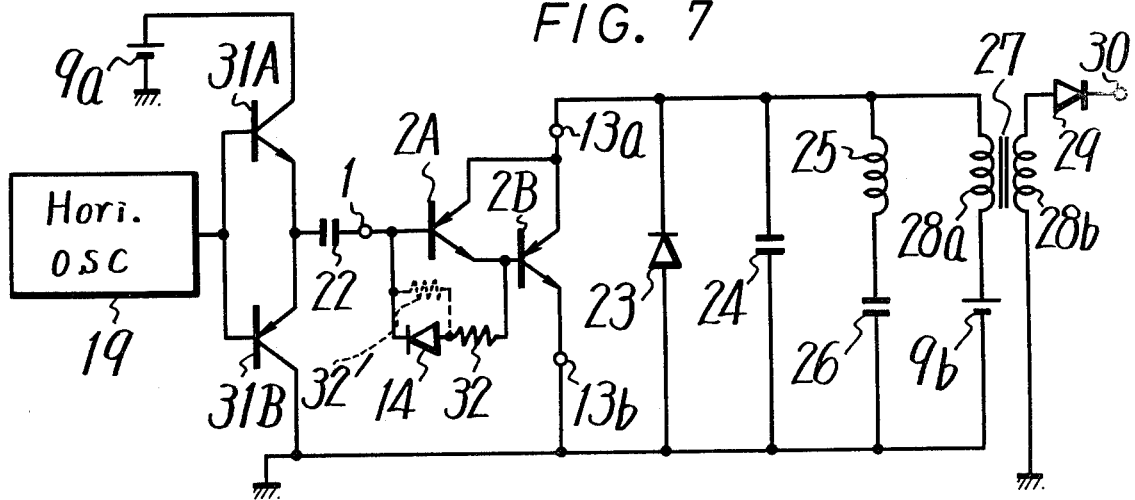
FIG. 7 is a schematic diagram of a horizontal deflection circuit of a television receiver employing a switching circuit according to a second embodiment of the invention.

A second embodiment of the invention, which eliminates the need for coil 21, is shown in FIG. 7. A complementary pair of transistors 31A and 31B have their bases connected to the output of horizontal oscillator 19. Transistor 31A is an NPN transistor having its collector connected to power supply source 9a and its emitter connected to the emitter of PNP transistor 31B. The collector of PNP transistor 31B is connected to ground. The junction of the emitters of transistors 31A and 31B is connected to one terminal of capacitor 22. A resistor 32 is connected in series with diode 14 to limit the negative turn-off current to the gate of gate-controlled switch 2B. Alternatively, a parallel resistor 32', shown in dashed line in parallel with diode 14 may be substituted for series resistor 32.

Figure 6A:
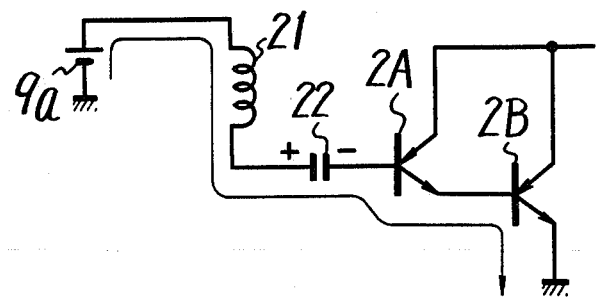
FIG. 6A is a simplified equivalent circuit of the embodiment of the invention shown in FIG. 4 showing a current path which is effective while applying power to a load.
Figure 6B:
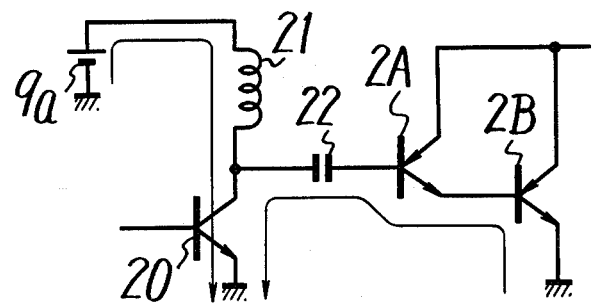
FIG. 6B is a simplified equivalent circuit of the embodiment of the invention shown in FIG. 4 showing a current path effective during the first step in removing power from the load.
Figure 6C:
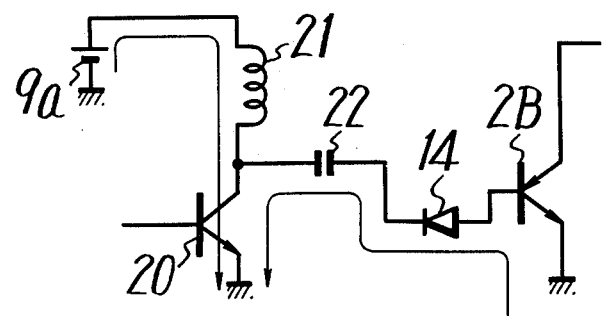
FIG. 6C is a simplified equivalent circuit of the embodiment of the invention shown in FIG. 4 showing a current path effective during the second step in removing power from the load.

When the output of horizontal oscillator 19 is positive, transistor 31A is turned ON and transistor 31B is turned OFF. Thus, a charge path similar to that shown in FIG. 6A is established wherein the collector-emitter path of transistor 31A is substituted for coil 21. When the output of horizontal oscillator 19 becomes low, transistor 31A is cut off and transistor 31B is turned on. This produces the discharge paths from gate-controlled switches 2A and 2B, diode 14 and capacitor 22 which was provided by transistor 20 in FIGS. 6B and 6C, thus sequentially turning OFF gate-controlled switches 2A and 2B respectively.

In order to further reduce the required driving signal applied to input terminal 1, three gate-controlled switches may be employed with suitable delay diodes in place of the two gate-controlled switches illustrated and described in the preceding. In addition, other means of applying drive signals to input terminal 1 of the switching circuit may be employed without departing from the spirit of the present invention. For example, a drive circuit may be used in which a resistor is substituted for coil 21 of FIG. 4, the capacitor 22 of FIG. 7 may be omitted and instead, a negative power supply source may be connected between the collector of transistor 31B and ground.

Having described specific embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

We claim:

1. A switching circuit comprising:
a first three-junction gate-controlled switch having a first anode electrode, a first cathode electrode and a first gate electrode, said first gate-controlled switch requiring a predetermined time to go from an ON to an OFF condition,
said first gate electrode being an input terminal of said switching circuit; a second three-junction gate-controlled switch having a second anode electrode, a second cathode electrode and a second gate electrode; said first and second anode electrodes being connected together; said second cathode electrode and said second anode electrode being first and second load terminals of said switching circuit connectable in series with a current path of a load for the control of current therethrough; said first cathode electrode being connected to said second gate electrode for driving said second three-junction gate-controlled switch by current from said first cathode electrode to said second gate electrode; and a diode having a cathode terminal connected to said first gate electrode and an anode terminal connected to said second gate electrode, said diode having a delay time for changing from a non-conducting to a conducting condition, said delay time being longer than said time required for said first gate-controlled switch to go from said ON to said OFF condition.

2. A horizontal deflection circuit for a television system comprising: a horizontal oscillator producing a repetitive signal having first and second voltage levels; a switching circuit having a first three-junction gate-controlled switch which has an ON condition and an OFF condition, a second three-junction gate-controlled switch which has an ON condition and an OFF condition; said first and second gate-controlled switches being connected in a Darlington-type connection; said switching circuit having an input terminal and first and second load terminals; a damper diode connected in parallel with said first and second load terminals; a resonant capacitor connected in parallel with said first and second load terminals; a deflection coil connected in series with an S-shape correction capacitor, the series connection of said coil and correction capacitor being connected in parallel with said first and second load terminals; a fly-back transformer having a primary winding and a secondary winding; said primary winding being connected in series with a power supply source and the series connection of said primary winding and power supply source being connected in parallel with said first and second load terminals; means responsive to said first voltage level of said horizontal oscillator for applying a positive voltage to said input terminal and responsive to said second voltage level of said horizontal oscillator for applying a negative voltage to said input terminal; and delay means for delaying change of said second gate-controlled switch from its ON to its OFF condition until after said first gate-controlled switch is changed from its ON to its OFF condition.

3. A horizontal deflection circuit according to claim 2, wherein said delay means includes a diode having a conducting and a non-conducting condition, said diode being in said non-conducting condition when said positive voltage is applied to said input terminal and said diode requiring a time to change from its non-conducting to its conducting condition in response to application of said negative voltage to said input terminal which exceeds the time required for said first gate-controlled switch to change from its ON to its OFF condition.

4. A horizontal deflection circuit according to claim 2, wherein said means responsive to the first and second voltage levels includes at least one transistor having an emitter-collector path operative in response to said first and second voltage levels to become alternately conducting and non-conducting respectively, another power supply having a voltage connected in series with said emitter-collector path, and coupling means for coupling between said emitter-collector path and said input terminal.

5. A horizontal deflection circuit according to claim 4, wherein said coupling means includes a capacitor.

6. A horizontal deflection circuit according to claim 4, wherein said at least one transistor includes first and second transistors, said first transistor being operative during said first voltage level to apply said voltage from said another power supply to said means for coupling, said second transistor being effective during said second voltage level to apply a reference voltage level to said means for coupling.

7. A horizontal deflection circuit according to claim 6, wherein said means for coupling includes a capacitor and said reference level is ground.

8. A horizontal deflection circuit according to claim 6, further comprising means for limiting a current through said delay means.

9. A horizontal deflection circuit according to claim 8, wherein said delay means includes a diode and said means for limiting includes a resistor.

10. A horizontal deflection circuit for a television system comprising: a deflection coil; a fly-back transformer; a damper diode; a resonant capacitor; said deflection coil, fly-back transformer, damper diode and resonant capacitor being connected together and constituting a load; a horizontal oscillator producing a repetitive signal having first and second voltage levels; a switching circuit having an input terminal and first and second load terminals; said load being connected to said first and second load terminals; said switching circuit including a first three-junction gate-controlled switch having a first gate, a first anode and a first cathode and a second three-junction gate-controlled switch having a second gate, a second anode and a second cathode; said first gate being connected to said input terminal; said second cathode being connected to said first load terminal; said first and second anodes being connected to said second load terminal; said first cathode being connected to said second gate; means responsive to said first and second voltage levels for applying positive and negative signals to said input terminal; said first and second gate-controlled switches having ON and OFF conditions; and delay means for delaying a change of said second gate-controlled switch from said ON to said OFF condition until said first gate-controlled switch has completed a change from said ON to said OFF condition.

* * * * *